(12) United States Patent
Zhang

(10) Patent No.: US 10,901,331 B2
(45) Date of Patent: Jan. 26, 2021

(54) COAXIAL MASK ALIGNMENT DEVICE, PHOTOLITHOGRAPHY APPARATUS AND ALIGNMENT METHOD

(71) Applicant: SHANGHAI MICRO ELECTRONICS EQUIPMENT (GROUP) CO., LTD., Shanghai (CN)

(72) Inventor: Chengshuang Zhang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/090,015

(22) PCT Filed: Mar. 31, 2017

(86) PCT No.: PCT/CN2017/078939
§ 371 (c)(1),
(2) Date: Sep. 28, 2018

(87) PCT Pub. No.: WO2017/167260
PCT Pub. Date: Oct. 5, 2017

(65) Prior Publication Data
US 2019/0113856 A1  Apr. 18, 2019

(30) Foreign Application Priority Data

Mar. 31, 2016 (CN) .......................... 2016 1 0200702

(51) Int. Cl.
*G03F 9/00* (2006.01)
*G03F 7/20* (2006.01)

(52) U.S. Cl.
CPC ........ *G03F 9/7088* (2013.01); *G03F 7/70716* (2013.01); *G03F 9/7003* (2013.01); *G03F 9/7015* (2013.01); *G03F 9/7065* (2013.01)

(58) Field of Classification Search
None
See application file for complete search history.

(56) References Cited

U.S. PATENT DOCUMENTS

2005/0128449 A1* 6/2005 Phillips ............... G03F 7/70716
355/53
2006/0066904 A1  3/2006 Fischer

FOREIGN PATENT DOCUMENTS

CN  1794095 A  6/2006
CN  101101458 A  1/2008
(Continued)

*Primary Examiner* — Michelle M Iacoletti
(74) *Attorney, Agent, or Firm* — Muncy, Geissler, Olds & Lowe, P.C.

(57) ABSTRACT

A coaxial reticle alignment device, a lithography apparatus and alignment methods are disclosed. The coaxial reticle alignment device includes: illumination modules (A, B), each configured to provide an alignment light beam; a projection objective (8) under a reticle (5); a reference plate (9) on a workpiece stage (12), configured to carry a reference mark (10); and an image detection and processing module (11) under the reference plate (9). The reference mark (10) is located within a FOV of the image detection and processing module (11), and during movement of the workpiece stage (12), the image detection and processing module (11) receives the alignment light beam having passed sequentially through the reticle alignment mark (6, 7), the projection objective (8) and the reference mark (10), it captures images of the reticle alignment mark (6, 7) and the reference mark (10) which are processed to derive relative positional information between the reticle alignment mark (6, 7) and the reference mark (10) that enables the alignment of the reticle (5) with the workpiece stage (12). The coaxial reticle alignment device adopts dedicated separate illumination means, has a simple structure, allows easy operation and improves alignment efficiency.

11 Claims, 3 Drawing Sheets

(a)

(b)

(56) References Cited

FOREIGN PATENT DOCUMENTS

| | | | |
|---|---|---|---|
| CN | 101382743 A | | 3/2009 |
| CN | 102081312 A | | 6/2011 |
| CN | 102540782 A | | 7/2012 |
| CN | 102890422 A | | 1/2013 |
| CN | 103197518 A | | 7/2013 |
| CN | 103383531 A | | 11/2013 |
| CN | 104678720 A | | 6/2015 |
| CN | 205608393 U | | 9/2016 |
| JP | 0950959 A | | 2/1997 |
| JP | 09312251 A | * | 12/1997 |
| JP | 2010219452 A | * | 9/2010 |
| TW | 201005447 A1 | | 2/2010 |

* cited by examiner

COAXIAL MASK ALIGNMENT DEVICE, PHOTOLITHOGRAPHY APPARATUS AND ALIGNMENT METHOD

TECHNICAL FIELD

The present invention relates to the field of semiconductor equipment and, in particular, to a coaxial reticle alignment device, a photolithography apparatus and alignment methods.

BACKGROUND

During the fabrication of integrated circuit (IC) chips, in order to achieve desired accuracy of the used lithography machine, it is necessary to accurately establish a relationship between various coordinate systems in the lithography machine so that the reticle, the reticle stage, the objective, the wafer and the workpiece stage can operate in a unified positional relationship. Generally, the alignment system in a lithography machine includes a reticle alignment system and a wafer alignment system. Most reticle alignment systems, for example, those for advanced packaging lithography systems, quasi-lithography machines and defect inspection equipment, are designed to follow the principles of machine vision. In such a design, a reticle mark alignment system is typically disposed above the reticle (reticle marks) to image and detect the reticle marks while being intervened by a glass plate with a certain thickness. Alternatively, the reticle mark alignment system may also be arranged under the reticle (reticle mark) to directly image and detect the marks.

When the system is disposed above the reticle (reticle marks), sensors are required to have a depth of focus to account for uncertainties in the defocus introduced by the reticle thickness fabrication tolerance. In order to achieve the required depth of focus, alignment accuracy is often compromised or a vertical focusing mechanism is added, which tends to increase the structural complexity. On the other hand, when the system is arranged under the reticle (reticle mark), the reticle stage must be made larger to have an additional room for the alignment system, which can also lead to increased structural complexity.

An existing TFT lithography machine often accomplishes reticle alignment using its exposure light source. However, for a packaging lithography machine, since it usually operates at a high exposure dosage of the illumination light source, detector damage and lowered measurement accuracy may occur if it also resorts to the light source for reticle alignment. Furthermore, as the existing TFT lithography machine often adopts two sets of imaging lenses and detectors in the workpiece stage for the imaging and detection of reticle marks, it is usually complicated in structure and expensive.

SUMMARY OF THE INVENTION

It is an objective of the present invention to provide a coaxial reticle alignment device, a lithography apparatus and alignment methods, which are capable of more efficient alignment and immune from errors from reticle thickness tolerance or error occurring among different alignment actions.

To this end, the present invention provides a coaxial reticle alignment device for aligning a reticle with a workpiece stage, including:

an illumination module, configured to irradiate an alignment light beam onto a reticle alignment mark on the reticle;

a projection objective, disposed under the reticle and configured to image the reticle alignment mark;

a reference plate, disposed on the workpiece stage and configured to carry a reference mark; and an image detection and processing module arranged under the reference plate, wherein the reference mark is located within a field of view of the image detection and processing module, and wherein during movement of the workpiece stage relative to the reticle, the image detection and processing module receives the alignment light beam that has passed sequentially through the reticle alignment mark, the projection objective and the reference mark and hence captures images of the reticle alignment mark and the reference mark, which are processed to derive relative positional information between the reticle alignment mark and the reference mark, so as to align the reticle with the workpiece stage.

Optionally, the reticle may be provided with one or more reticle alignment marks, and a same number of illumination modules are included, each of the illumination modules corresponding to a respective one of the reticle alignment marks.

Optionally, the reference mark and the image detection and processing module may be shared by the reticle alignment marks, and wherein during movement of the image detection and processing module with the workpiece stage relative to the reticle, the image detection and processing module successively receives alignment light beams that have passed through the projection objective to obtain relative positional information between each of the reticle alignment marks and the reference mark.

Optionally, in the coaxial reticle alignment device, the image detection and processing module may be disposed within the workpiece stage.

Optionally, in the coaxial reticle alignment device, the reference mark may be positioned at an optimum focal plane of the image detection and processing module.

Optionally, in the coaxial reticle alignment device, the image detection and processing module may include an imaging lens group, a detector and a processing unit.

Optionally, in the coaxial reticle alignment device, the detector may be a CCD or CMOS device.

Optionally, in the coaxial reticle alignment device, the reference mark may be a reflective metal mark.

Optionally, in the coaxial reticle alignment device, alignment light beams provided by the illumination modules may have a same wavelength.

Optionally, in the coaxial reticle alignment device, the illumination modules may provide alignment light beams in an ultraviolet spectrum.

The present invention also provides a lithography apparatus, including a coaxial reticle alignment device for aligning a reticle with an object to be exposed on a workpiece stage, wherein the coaxial reticle alignment device is implemented as that as defined above.

The present invention also provides a reticle alignment method, including the steps of:

1) irradiating a first alignment light beam emanated from a first illumination module onto a first reticle alignment mark on a reticle and moving a workpiece stage so that the first alignment light beam passes through a projection objective and is incident on a reference mark on the workpiece stage;

2) receiving, by an image detection and processing module disposed under the reference mark, the first alignment light beam that has passed sequentially through the first reticle alignment mark, the projection objective and the reference mark and hence capturing images of the first reticle alignment mark and the reference mark, which are then processed to derive first relative positional information between the first reticle alignment mark and the reference mark;

3) irradiating a second alignment light beam emanated from a second illumination module onto a second reticle alignment mark on the reticle and moving the workpiece stage so that the second alignment light beam passes through the projection objective and is incident on the reference mark; and 4) receiving, by the image detection and processing module, the second alignment light beam that has passed sequentially through the second reticle alignment mark, the projection objective and the reference mark and hence capturing images of the second reticle alignment mark and the reference mark, which are then processed to derive second relative positional information between the second reticle alignment mark and the reference mark, and aligning the reticle with the workpiece stage based both on the first relative positional information between the first reticle alignment mark and the reference mark and on the second relative positional information between the second reticle alignment mark and the reference mark.

The present invention also provides another reticle alignment method, including the steps of:

1) irradiating a first alignment light beam emanated from a first illumination module onto a first reticle alignment mark on a reticle and a second alignment light beam emanated from a second illumination module onto a second reticle alignment mark on the reticle and moving a workpiece stage so that the first alignment light beam passes through a projection objective and is incident on a reference mark on a reference plate;

2) receiving, by an image detection and processing module disposed under the reference mark, the first alignment light beam that has passed sequentially through the first reticle alignment mark, the projection objective and the reference mark and hence capturing images of the first reticle alignment mark and the reference mark, which are then processed to derive first relative positional information between the first reticle alignment mark and the reference mark;

3) moving the workpiece stage so that the second alignment light beam passes through the projection objective and is incident on the reference mark; and 4) receiving, by the image detection and processing module, the second alignment light beam that has passed sequentially through the second reticle alignment mark, the projection objective and the reference mark and hence capturing images of the second reticle alignment mark and the reference mark, which are then processed to derive second relative positional information between the second reticle alignment mark and the reference mark, and aligning the reticle with the workpiece stage based both on the first relative positional information between the first reticle alignment mark and the reference mark and on the second relative positional information between the second reticle alignment mark and the reference mark.

Optionally, in the reticle alignment method, in step 1, upon the first alignment light beam passing through the projection objective and striking the reference mark on the workpiece stage, the second alignment light beam may be offset from the reference plate.

Optionally, in the reticle alignment method, the image detection and processing module may be disposed on the workpiece stage and spaced apart from an edge of the reference plate by a distance that is at least equal to $d \times M + \varphi/2$, where d represents a distance between the first reticle alignment mark and the second reticle alignment mark on the reticle; M represents a magnification of the projection objective; and $\varphi$ represents a diameter of a blur spot formed on a focal plane of the projection objective by the first or second alignment light beam passing through the projection objective.

Compared with the prior art, in the coaxial reticle alignment device, the lithography apparatus and the alignment methods provided in the present invention, dedicated separate illumination means is employed, which allows miniaturization. In addition, it can be embedded within the workpiece stage, enabling immunization from errors from reticle thickness tolerance and avoiding structural complication of the reticle alignment system. Moreover, simultaneous imaging of the reference mark and the reticle alignment mark by the image detection and processing module enables simultaneous measurement of the reticle alignment mark and the reference mark, resulting in a further improvement in the alignment efficiency and reducing errors occurring among multiple different alignment actions.

DETAILED DESCRIPTION OF PREFERRED EMBODIMENTS

The coaxial reticle alignment device, the lithography apparatus and the alignment methods of the present invention will be described in greater detail below with reference to the accompanying schematics, which present preferred embodiments of the invention. It is to be appreciated that those skilled in the art can make changes to the invention disclosed herein while still obtaining the beneficial results thereof. Therefore, the following description shall be construed as being intended to be widely known by those skilled in the art rather than as limiting the invention.

For simplicity and clarity of illustration, not all features of the disclosed specific embodiment are described. Additionally, description and details of well-known functions and structures are omitted to avoid unnecessarily obscuring the invention. The development of any specific embodiment of the present invention includes specific decisions made to achieve the developer's specific goals, such as compliance with system-related and business-related constraints, which will vary from one implementation to another. Moreover, such a development effort might be complex and time consuming but would nevertheless be a routine undertaking for those of ordinary skill in the art.

The present invention will be further described in the following paragraphs by way of examples with reference to the accompanying drawings. Features and advantages of the invention will be more apparent from the following detailed description, and from the appended claims. Note that the accompanying drawings are provided in a very simplified form not necessarily presented to scale, with the only intention of facilitating convenience and clarity in explaining a few illustrative examples of the invention.

Preferred embodiments of the coaxial reticle alignment device, the lithography apparatus and the alignment methods will be enumerated below in order for the present invention to be better understood. It is to be noted that the invention is not limited to the embodiments disclosed below but intended to embrace all modifications made by those of ordinary skill in the art based on common general knowledge within its spirit and scope.

Figure 1:
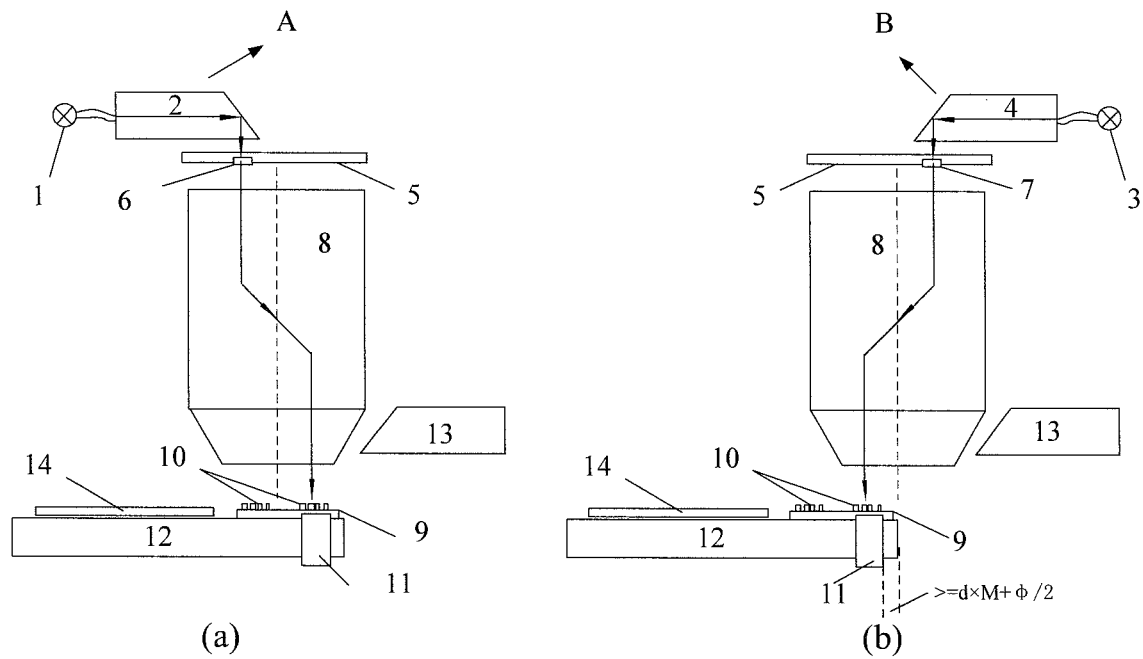
FIG. 1 is a structural schematic of a coaxial reticle alignment device according to an embodiment of the present invention.

Reference is now made to FIG. 1, a structural schematic of a coaxial reticle alignment device according to an embodiment of the present invention. As shown, the coaxial reticle alignment device, for aligning a reticle 5 with a workpiece stage 12, includes: illumination modules A, B, each configured to irradiate an alignment light beam onto a respective one of reticle alignment marks 6, 7 on the reticle 5; a projection objective 8 under the reticle 5, configured to image the reticle alignment marks 6, 7; a reference plate 9 on the workpiece stage 12, configured to support a reference mark 10; and an image detection and processing module 11 under the reference plate 9. The reference mark 10 is located within a field of view (FOV) of the image detection and processing module 11. When the workpiece stage 12 moves so that an image of the reticle alignment mark 6 that is illuminated by the illumination module A is formed by the projection objective 8 in the FOV of the image detection and processing module 11 (as shown in FIG. 1(a)), the image detection and processing module 11 receives the alignment light beam that has passed sequentially through the reticle alignment mark 6, the projection objective 8 and the reference mark 10 and hence captures images of the reticle alignment mark 6 and the reference mark 10, Which are then processed to derive first relative positional information between the reticle alignment mark 6 and the reference mark 10. When the workpiece stage 12 further moves so that an image of the reticle alignment mark 7 that is illuminated by the illumination module B is formed by the projection objective 8 in the FOV of the image detection and processing module 11 (as shown in FIG. 1(b)), the image detection and processing module 11 receives the alignment light beam that has passed sequentially through the reticle alignment mark 7, the projection objective 8 and the reference mark 10 and hence captures images of the reticle alignment mark 7 and the reference mark 10, which are then processed to derive second relative positional information between the reticle alignment mark 7 and the reference mark 10. The first and second positional information can be used in the alignment of the reticle 5 with the workpiece stage 12.

The reticle 5 may be provided with one or more reticle alignment marks, and a same number of illumination modules may be included, each corresponding to a respective one of the reticle alignment marks. For example, in a preferred embodiment of the present invention, as shown FIG. 1, two reticle alignment marks, i.e., the first reticle alignment mark 6 and the second reticle alignment mark 7 are provided, and correspondingly, two illumination modules, i.e., the first illumination module A and the second illumination module B, are included.

The first illumination module A may include a light source 1 and an illumination lens group 2. Light emanated from the light source 1 may be processed by the illumination lens group 2 to form a first alignment light beam. Similarly, the second illumination module B may include a light source 3 and an illumination lens group 4, and light emanated from the light source 3 may be processed by the illumination lens group 4 to form a second alignment light beam.

Preferably, the alignment light beams provided by the first and second illumination modules A, B have the same wavelength, for example, within the ultraviolet (UV) spectrum.

In addition, in order to facilitate the generation and use of the alignment light beams, each of the illumination modules may include a shutter (not shown) which can be opened as desired to allow the corresponding alignment light beam to pass therethrough to illuminate the reticle 5 or the like.

Each of the projection objective 8, the reference mark 10 and the image detection and processing module 11 is shared by the reticle alignment marks 6, 7. The image detection and processing module 11 successively receives the alignment light beams from the projection objective 8 during the movement of the workpiece stage 12, based on which the relative positional information is derived between the reticle alignment marks 6, 7 and the reference mark 10.

Figure 2:
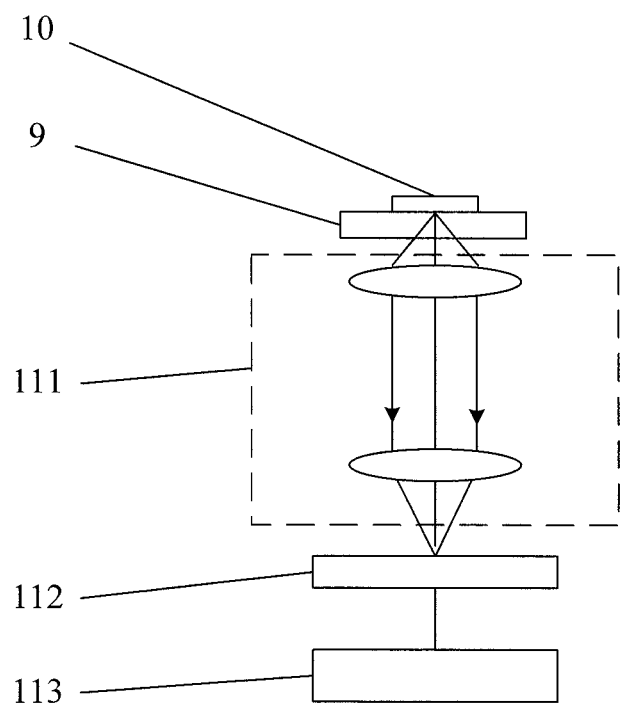
FIG. 2 is a structural schematic of a reference plate and an imaging module in the coaxial reticle alignment device.

Preferably, the image detection and processing module 11 is disposed within the workpiece stage 12. As shown in FIG. 2, the image detection and processing module 11 may include an imaging lens group 111, a detector 112 and a processing unit 113. The detector 112 may be a CCD or CMOS device capable of real-time image capture. The processing unit 113 may run in a separate processor which processes the captured images to derive pixel positions of the reticle alignment marks 6, 7 and the reference mark 10 in the FOV. An aligned position of the reticle 5 with respect to the workpiece stage 12 is then obtained using an object-to-image conversion matrix.

The reference mark 12 may be, for example, a reflective metal mark. In a preferred implementation, the reference mark 12 may be provided on a reference plate 9. The reference plate 9 may be integrated with the image detection and processing module 11 and is arranged above the image detection and processing module 11. Further as shown in FIG. 2, the reference mark 10 may be located at an optimum focal plane of the image detection and processing module 11.

As the reference plate 9 and the image detection and processing module 11 are carried by the workpiece stage 12, they are movable in synchronization with the workpiece stage 12. Further, they can be disposed on a vertical motion unit (if present) of the workpiece stage 12 so as to facilitate adjustment of the positions of the reference plate 9 and the image detection and processing module 11. As such, the position of the workpiece stage 12, and hence that of a workpiece 14 placed on the workpiece stage 12, may be derived from the relative positions between the reference mark 10 and the reticle alignment marks 6, 7, Furthermore, as shown in FIG. 1, the coaxial reticle alignment device may additionally include an off-axis alignment lens 13 disposed beside the objective 8. An off-axis reference mark corresponding to the off-axis alignment lens 13 is provided on the reference plate 9, i.e., the off-axis reference mark is also formed on the reference plate 9. The off-axis reference mark may be implemented either as the reference mark 10 or a separate reference mark at a different position on the reference plate 9.

On such a basis, the present invention also provides a lithography apparatus including a coaxial reticle alignment device for aligning a reticle with an object to be exposed. The coaxial reticle alignment device may be that as defined above.

Figure 3:
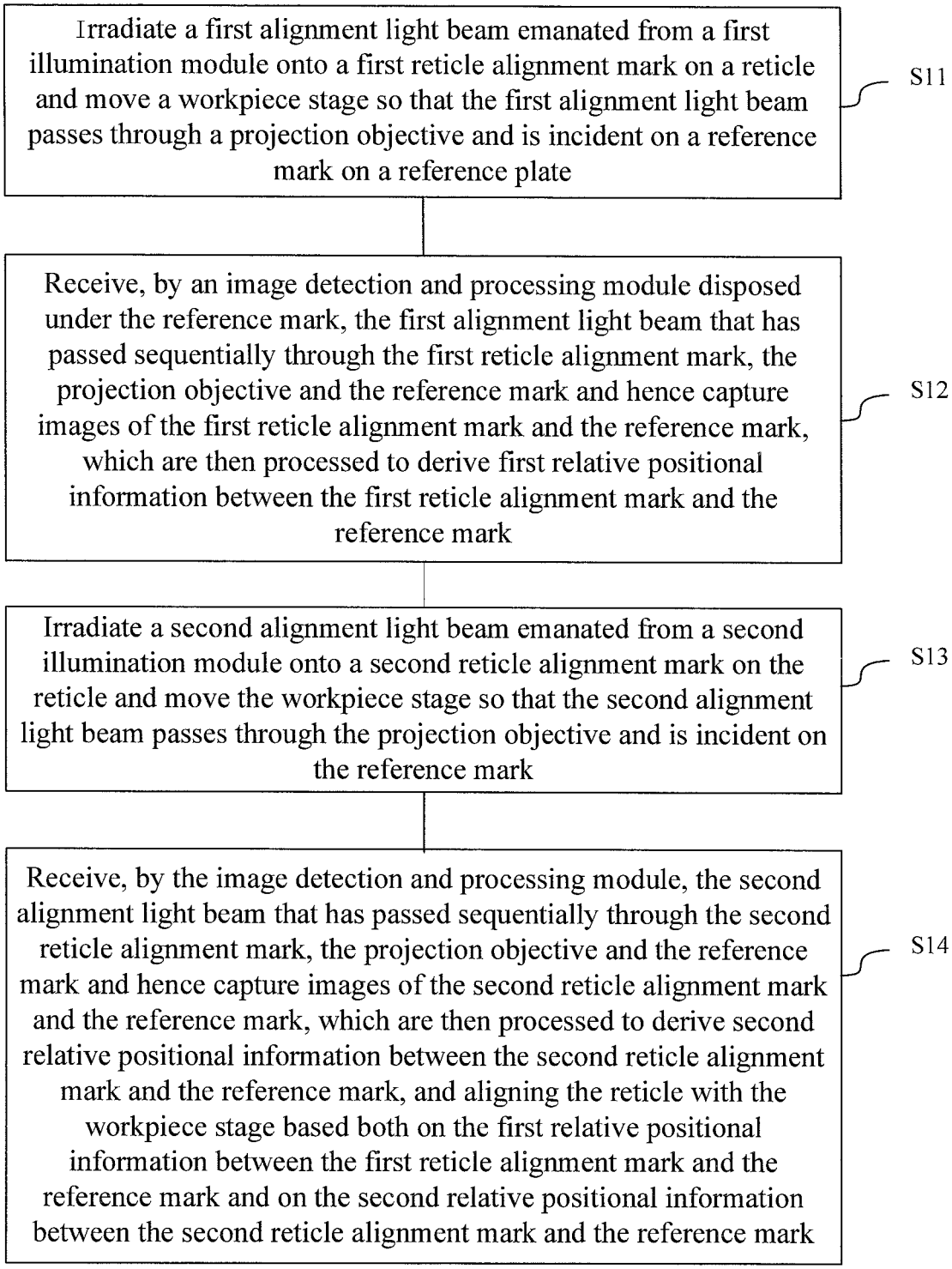
FIG. 3 is a flowchart graphically illustrating a reticle alignment method according to another embodiment of the present invention.

A reticle alignment method according to another embodiment of the present invention will be described in detail below. Referring to FIGS. 1 and 3, the reticle alignment method includes the following steps.

In step S11, the first illumination module A emits a first alignment light beam Which is irradiated onto the first reticle alignment mark 6 on the reticle 5. The workpiece stage 12 is moved so that the first alignment light beam passes through the projection objective 8 and is incident onto the reference mark 10 on the workpiece stage 12.

In step S12, the image detection and processing module 11 under the reference mark 10 receives the first alignment light beam that has passed sequentially through the first reticle alignment mark 6, the projection objective 8 and the reference mark 10 and hence capture images of the first reticle alignment mark 6 and the reference mark 10, which are then processed to derive first relative positional information between the first reticle alignment mark 6 and the reference mark 10.

In step S13 the second illumination module B emits a second alignment light beam which is irradiated onto the second reticle alignment mark 7 on the reticle 5. The workpiece stage 12 is further moved so that the second alignment light beam passes through the projection objective 8 and is incident onto the reference mark 10.

In step S14, the image detection and processing module 11 receives the second alignment light beam that has passed sequentially through the second reticle alignment mark 7, the projection objective 8 and the reference mark 10 and hence capture images of the second reticle alignment mark 7 and the reference mark 10, which are then processed to derive second relative positional information between the second reticle alignment mark 7 and the reference mark 10. Based on the first relative positional information between the first reticle alignment mark 6 and the reference mark 10 and the second relative positional information between the second reticle alignment mark 7 and the reference mark 10, the reticle 5 is aligned with the workpiece stage 12.

Figure 4:
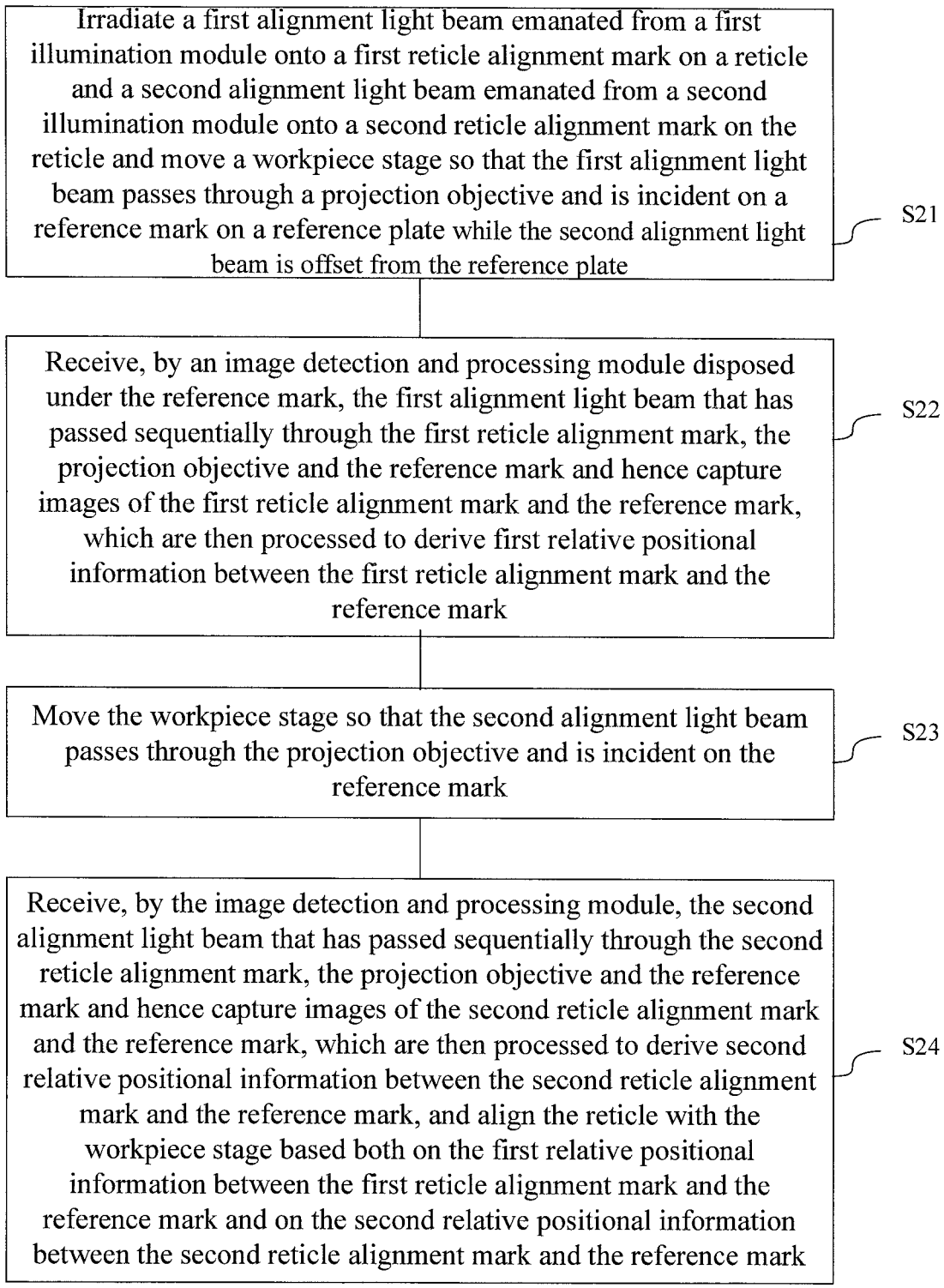
FIG. 4 is a flowchart graphically illustrating a reticle alignment method according to a further embodiment of the present invention.

A reticle alignment method according to another embodiment of the present invention will be described in detail below. Referring to FIGS. 1 and 4, the reticle alignment method includes the following steps.

In step S21, the first illumination module A emits a first alignment light beam which is irradiated onto the first reticle alignment mark 6 on the reticle 5. At the same time, the second illumination module B emits a second alignment light beam which is irradiated onto the second reticle alignment mark 7 on the reticle 5. The workpiece stage 12 is moved so that the first alignment light beam passes through the projection objective 8 and is incident onto the reference mark 10 on the reference plate 12. In step S21, upon the first alignment light beam passing through the projection objective 8 and irradiating onto the reference mark 10 on the workpiece stage 12, the second alignment light beam is offset from the reference plate 9.

In step S22, the image detection and processing module 11 under the reference mark 10 receives the first alignment light beam that has passed sequentially through the first reticle alignment mark 6, the projection objective 8 and the reference mark 10 and hence capture images of the first reticle alignment mark 6 and the reference mark 10, which are then processed to derive first relative positional information between the first reticle alignment mark 6 and the reference mark 10.

In step S23, the workpiece stage 12 is further moved so that the second alignment light beam passes through the projection objective 8 and is incident onto the reference mark 10. At this point, the first alignment light beam is offset from the reference plate 9.

In step S24, the image detection and processing module 11 receives the second alignment light beam that has passed sequentially through the second reticle alignment mark 7, the projection objective 8 and the reference mark 10 and hence capture images of the second reticle alignment mark 7 and the reference mark 10, which are then processed to derive second relative positional information between the second reticle alignment mark 7 and the reference mark 10. Based on the first relative positional information between the first reticle alignment mark 6 and the reference mark 10 and the second relative positional information between the second reticle alignment mark 7 and the reference mark 10, the reticle 5 is aligned with the workpiece stage 12.

Considering that during the detection of one alignment light beam, the other alignment light beam also travels through the projection objective 8 and reaches the workpiece stage 12, in order to prevent the undesired exposure of the workpiece 14 by the other alignment light beam (e.g., a UV light beam), the layout of the coaxial reticle alignment device may be so designed that the other alignment light beam is not irradiated onto the workpiece 14. This layout depends on the stroke of the workpiece stage, the distance d between the first reticle alignment mark 6 and the second reticle alignment mark 7 and the magnification M of the projection objective. Projections of the first and second reticle alignment marks 6, 7 on the focal plane of the projection objective are spaced apart from each other by a center-to-center distance that is equal to $D=d \times M$. When further taking into account the collimation constraint, i.e., blurring of a projected image on the focal plane of the projection objective, then the image detection and processing module 11 should be spaced apart from an edge of the reference plate 9 by a distance that is at least equal to $d \times M + \varphi/2$, where $\varphi$ denotes a diameter of the blur spot.

Compared to the prior art, in the coaxial reticle alignment device, the lithography apparatus and the alignment methods of the present invention, each reticle alignment mark is equipped with a separate illumination module, and the alignment can be accomplished using only one image detection and processing module. Therefore, structural compactness is achievable. Moreover, the single image detection and processing module is disposed under the reticle (reticle mark) and can be embedded within the workpiece stage. This circumvents the problem of having to take into account reticle thickness tolerance and simplifies the structure of the reticle alignment system. Further, simultaneous imaging of the reference mark and the reticle alignment mark by the image detection and processing module enables simultaneous measurement of the reticle alignment mark and the reference mark, resulting in a further improvement in the alignment efficiency and reducing errors occurring among multiple different alignment actions.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A coaxial reticle alignment device for aligning a reticle with a workpiece stage, comprising:
   an illumination module, configured to irradiate an alignment light beam onto a first reticle alignment mark or a second reticle alignment mark on the reticle;
   a projection objective, disposed under the reticle and configured to respectively image the first and second reticle alignment marks;

a reference plate, disposed on the workpiece stage and configured to carry a reference mark; and an image detection and processing module arranged on the workpiece stage, wherein the reference mark is located within a field of view of the image detection and processing module, and wherein during movement of the workpiece stage relative to the reticle, the image detection and processing module receives a first alignment light beam that has passed sequentially through the first reticle alignment mark, the projection objective and the reference mark and a second alignment light beam that has passed sequentially through the second reticle alignment mark, the projection objective and the reference mark and hence captures images of the first and second reticle alignment marks and the reference mark, which are processed to derive relative positional information between the first reticle alignment mark and the reference mark and between the second reticle alignment mark and the reference mark, so as to align the reticle with the workpiece stage, wherein the reference mark and the image detection and processing module are shared by the first and second reticle alignment marks, and wherein the image detection and processing module is spaced apart from an edge of the reference plate by a distance that is at least equal to $d \times M + \varphi/2$, where d represents a distance between the first reticle alignment mark and the second reticle alignment mark on the reticle; M represents a magnification of the projection objective; and $\varphi$ represents a diameter of a blur spot formed on a focal plane of the projection objective by the alignment light beam passing through the projection objective.

2. The coaxial reticle alignment device according to claim 1, wherein two illumination modules are included, each of the illumination modules corresponding to a respective one of the first and second reticle alignment marks.

3. The coaxial reticle alignment device according to claim 2, wherein alignment light beams provided by the illumination modules have a same wavelength.

4. The coaxial reticle alignment device according to claim 3, wherein the illumination modules provide alignment light beams in an ultraviolet spectrum.

5. The coaxial reticle alignment device according to claim 1, wherein the reference mark is positioned at an optimum focal plane of the image detection and processing module.

6. The coaxial reticle alignment device according to claim 1, wherein the image detection and processing module comprises an imaging lens group, a detector and a processing unit.

7. The coaxial reticle alignment device according to claim 6, wherein the detector is a CCD or CMOS device.

8. A lithography apparatus, comprising a coaxial reticle alignment device for aligning a reticle with an object to be exposed on a workpiece stage, wherein the coaxial reticle alignment device is implemented according to claim 1.

9. A reticle alignment method, comprising the following steps in the sequence set forth:

1) irradiating a first alignment light beam emanated from a first illumination module onto a first reticle alignment mark on a reticle and moving a workpiece stage so that the first alignment light beam passes through a projection objective and is incident on a reference mark on the workpiece stage;

2) receiving, by an image detection and processing module disposed on the workpiece stage, the first alignment light beam that has passed sequentially through the first reticle alignment mark, the projection objective and the reference mark and hence capturing images of the first reticle alignment mark and the reference mark, which are then processed to derive first relative positional information between the first reticle alignment mark and the reference mark;

3) irradiating a second alignment light beam emanated from a second illumination module onto a second reticle alignment mark on the reticle and moving the workpiece stage so that the second alignment light beam passes through the projection objective and is incident on the reference mark, wherein during movement of the workpiece stage, the reference mark is located within a field of view of the image detection and processing module; and 4) receiving, by the image detection and processing module, the second alignment light beam that has passed sequentially through the second reticle alignment mark, the projection objective and the reference mark and hence capturing images of the second reticle alignment mark and the reference mark, which are then processed to derive second relative positional information between the second reticle alignment mark and the reference mark, and aligning the reticle with the workpiece stage based both on the first relative positional information between the first reticle alignment mark and the reference mark and on the second relative positional information between the second reticle alignment mark and the reference mark, wherein the reference mark and the image detection and processing module are shared by the first and second reticle alignment marks, wherein the image detection and processing module is spaced apart from an edge of the reference plate by a distance that is at least equal to $d \times M + \varphi/2$, where d represents a distance between the first reticle alignment mark and the second reticle alignment mark on the reticle; M represents a magnification of the projection objective; and $\varphi$ represents a diameter of a blur spot formed on a focal plane of the projection objective by the first or second alignment light beam passing through the projection objective.

10. A reticle alignment method, comprising the following steps in the sequence set forth:

1) irradiating a first alignment light beam emanated from a first illumination module onto a first reticle alignment mark on a reticle and a second alignment light beam emanated from a second illumination module onto a second reticle alignment mark on the reticle and moving a workpiece stage, so that the first alignment light beam passes through a projection objective and is incident on a reference mark on a reference plate, the reference mark is located within a field of view of the image detection and processing module;

2) receiving, by an image detection and processing module disposed on the workpiece stage, the first alignment light beam that has passed sequentially through the first reticle alignment mark, the projection objective and the reference mark and hence capturing images of the first reticle alignment mark and the reference mark, which are then processed to derive first relative positional information between the first reticle alignment mark and the reference mark;

3) moving the workpiece stage so that the second alignment light beam passes through the projection objective and is incident on the reference mark; and 4) receiving, by the image detection and processing module, the second alignment light beam that has passed sequentially through the second reticle alignment mark, the projection objective and the reference mark and hence capturing images of the second reticle alignment mark and the reference mark, which are then processed to derive second relative positional information between the second reticle alignment mark and the reference mark, and aligning the reticle with the workpiece stage based both on the first relative positional information between the first reticle alignment mark and the reference mark and on the second relative positional information between the second reticle alignment mark and the reference mark, wherein the reference mark and the image detection and processing module are shared by the first and second reticle alignment marks, wherein the image detection and processing module is spaced apart from an edge of the reference plate by a distance that is at least equal to $d \times M + \varphi/2$, where d represents a distance between the first reticle alignment mark and the second reticle alignment mark on the reticle; M represents a magnification of the projection objective; and $\varphi$ represents a diameter of a blur spot formed on a focal plane of the projection objective by the first or second alignment light beam passing through the projection objective.

11. The reticle alignment method according to claim 10, wherein in step 1, upon the first alignment light beam passing through the projection objective and irradiating onto the reference mark on the workpiece stage, the second alignment light beam is offset from the reference plate.

* * * * *